United States Patent
Stanescu et al.

(10) Patent No.: US 7,005,837 B2
(45) Date of Patent: *Feb. 28, 2006

(54) DIGITAL POTENTIOMETER INCLUDING OUTPUT BUFFER

(75) Inventors: Cornel D. Stanescu, Bucharest (RO); Adrian M. Tache, Bucharest (RO); Horia Profeta, Bucharest (RO); Radu H. Iacob, Santa Clara, CA (US); Adam P. Cosmin, Milpitas, CA (US)

(73) Assignee: Catalyst Semiconductor, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/723,948

(22) Filed: Nov. 26, 2003

(65) Prior Publication Data

US 2004/0108844 A1    Jun. 10, 2004

Related U.S. Application Data

(63) Continuation of application No. 10/081,499, filed on Feb. 20, 2002, now Pat. No. 6,771,053.

(51) Int. Cl.
G05F 1/12 (2006.01)

(52) U.S. Cl. .............. 323/298; 323/354; 365/185.08; 713/300

(58) Field of Classification Search .............. 323/293, 323/297, 298, 352, 353, 354; 377/52; 327/519, 327/594; 341/142; 365/185.05, 185.08; 713/300; 338/13
See application file for complete search history.

(56) References Cited

U.S. PATENT DOCUMENTS

| | | | |
|---|---|---|---|
| 4,271,486 A | 6/1981 | Dagostino et al. | |
| 4,468,607 A | 8/1984 | Tanaka et al. | |
| 4,477,920 A | * 10/1984 | Nygaard, Jr. | ............... 377/52 |
| 4,668,932 A | 5/1987 | Drori et al. | |
| 5,084,667 A | 1/1992 | Drori et al. | |
| 5,297,056 A | 3/1994 | Lee et al. | |
| 5,495,245 A | 2/1996 | Ashe | |
| 5,717,323 A | 2/1998 | Tailliet | |
| 6,201,491 B1 | 3/2001 | Brunolli et al. | |
| 6,320,451 B1 | 11/2001 | Harvey et al. | |
| 6,331,768 B1 | 12/2001 | Drori et al. | |
| 6,555,996 B1 | 4/2003 | Drori et al. | |
| 2004/0108844 A1 | 6/2004 | Stanescu et al. | |

OTHER PUBLICATIONS

Catalyst Semiconductor, Inc., "CAT515: 8-Bit Quad DACpot with RDY/BUSY and IND. Reference Inputs," 1997, pp. 1-11, no month.

(Continued)

*Primary Examiner*—Jessica Han
(74) *Attorney, Agent, or Firm*—Bever, Hoffman & Harms, LLP; E. Eric Hoffman

(57) ABSTRACT

A digital potentiometer is disclosed that includes first, second, and third signal terminals. A chain of series-connected impedance elements with multiple tap points is connected between the first and second signal terminals. A plurality of first switching devices are each connected to a respective one of the multiple tap points and to an internal wiper node. A configurable output stage is connected between the internal wiper node and the third signal terminal. The configurable output stage includes a buffer and a second switching device. The second switching device is operable to bypass the buffer. A switching circuit controls switching of the first switching devices. The switching circuit includes a Gray-code counter, a Gray-code decoder, and a make-before-break circuit that controls the timing of the switching of the wiper switches.

23 Claims, 5 Drawing Sheets

OTHER PUBLICATIONS

Catalyst Semiconductor, Inc., "CAT524: 8-Bit Quad Digital POT," 1998, pp. 25-36, no month.

Catalyst Semiconductor, Inc., "CAT514: 8-Bit Quad DACpot," 1997, pp. 1-13, no month.

Catalyst Semiconductor, Inc., "CAT514: 8-Bit Quad Digital POT," 1999, pp. 1-12, no month.

Catalyst Semiconductor, Inc., "CAT525: 8-Bit Quad Digital POT With Independent Reference Inputs," 1999, pp. 1-11, no month.

Catalyst Semiconductor, Inc., "CAT5111, CAT5112, CAT5113 and CAT5114: 100/32-Tap Digital POT with Independent Reference Inputs," 1999, pp. 1-6, no month.

Stanescu et al., "Taps Digitally Controlled Buffered Potentiometer," Proceedings of CAS 2001 International Semiconductor Conference, IEEE Catalog No. 01TH8547, pp. 535-538, Oct. 2001.

* cited by examiner

DIGITAL POTENTIOMETER INCLUDING OUTPUT BUFFER

RELATED APPLICATION

This application is a continuation of U.S. patent application Ser. No. 10/081,499, entitled "Buffered Configurable Nonvolatile Programmable Digital Potentiometer," which was filed on Feb. 20, 2002, issued as U.S. Pat. No. 6,771,053 on Aug. 3, 2004, and is incorporated herein by reference in its entirety.

TECHNICAL FIELD

The present invention relates generally to mixed-signal integrated circuits.

BACKGROUND

Nonvolatile programmable digital potentiometers, known also as nonvolatile reprogrammable electronic potentiometers or digitally controlled potentiometers, have been, for about the last 15 years, some of the most emerging front-line integrated circuits (ICs). They are used in LCD (Liquid Crystal Display) screen adjustment, volume control, automated product calibration, remote adjustment of equipment, signal processing, and other applications requiring the replacement of mechanical potentiometers.

FIG. 1 illustrates an embodiment of a nonvolatile reprogrammable potentiometer 10, as it is described in U.S. Pat. No. 4,668,932, the disclosure of which is hereby incorporated by reference. The potentiometer 10 includes a series chain of impedance elements 40 and additional circuitry for accessing the chain. The chain 40 has a first element 13, a last element 15, and one or more intermediate elements 12. The first element 13 is connected to a first terminal 14 (called high impedance terminal or H in other references), and the last element 15 is connected to a second terminal 16 (called low impedance terminal or L in other references). A plurality 44 of electrically controllable switches 20 connects every internal node (or tap) of the chain 40, to a third terminal 18 (called wiper terminal or W in other references). An output line 36 from a selecting block 38 controls each switch 20; the block 38 determines which electrically controllable switch 20 is closed at a given time. The selecting block 38 consists of a counter 24 connected to a decoder 22. The state of the counter may be incremented or decremented by signals on counter input terminals 28 and 30. The terminal 28 is used to apply count increment signal INCR, and the terminal 30 to apply an up/down control select signal UP/DN SEL. Storage block 60 stores the status of the counter 24 in response to a preselected signal. The storage block 60 consists of a nonvolatile memory 25, a control circuitry 26, and a circuitry 27 used to detect the status of the counter 24. The chip select line CHIP SEL 33 and the control line 32 are used to control when the memory 25 is updated and when it updates the counter 24, the control line 32 being connected to the supply voltage of the circuit.

Prior-art digital potentiometers, such as the potentiometer 10 of FIG. 1, tend to produce errors when operated as voltage dividers having a low impedance load connected to the third or wiper terminal 18.

SUMMARY

In the above described conventional digital potentiometer, additional current flows through the upper part of the resistor chain, if an output load is connected to ground, or through the lower part of the resistor chain, if the load is connected to a supply voltage. This additional current tends to cause errors in conventional digital potentiometers when operated as voltage dividers having a low impedance load connected to a wiper terminal thereof. In order to avoid this phenomenon, one aspect of the present invention is to provide a digital potentiometer including an output buffer, connected between an internal wiper terminal and an output terminal.

In one embodiment of the present invention, a digital potentiometer includes first, second, and third signal terminals and a chain of series-connected impedance elements with multiple tap points and endpoints connected to the first and second signal terminals. First switching devices are respectively connected to the multiple tap points and to an internal wiper node. A configurable output stage is connected between the internal wiper node and the third signal terminal and comprises: a rail-to-rail operational amplifier in unity-gain configuration, a bias circuitry, and a second switching device. The operational amplifier is connected in parallel with the second switching device. The bias circuitry and the second switching device are controlled by a configuration signal such that the operational amplifier is biased only if the second switching device is turned-off. A selecting block indicating an identity of a turned-on one of the first switching devices is also provided and is controlled by external and internal digital signals. A nonvolatile memory and control block provides for the storage of the identity of the turned-on one of the first switching devices, and for the storage of a status of the configuration signal. The nonvolatile memory and control block is controlled by external and internal digital signals.

This way, in certain applications, it is possible to take advantage of the low output resistance given by the analog buffer. Because certain applications need the removal of the buffer, the operational amplifier can be shutdown and bypassed by the second switching device, used in turned-on state, obtaining a behavior similar to the digital potentiometers without an output buffer.

Another aspect of the present invention improves overall reliability, by enhancing the writing procedure of the nonvolatile memory, which may comprise an EEPROM. Using a dual-writing circuitry, first complemented data, then the data itself, are written in the EEPROM nonvolatile memory, thereby improving the reliability.

Another aspect of the present invention provides an improved transient response at the output, or third, terminal, by using a Gray-code counter and decoder. The Gray-code counter has a single bit changed at one time and no decode glitch.

Make-before-break digital circuitry may be used in controlling the first switching devices such that an open one of the first switching devices must be closed before a closed one of the first switching devices opens. The make-before-break digital circuitry ensures that the internal wiper node is always connected to at least one tap of the chain.

Another aspect of the present invention provides a layout floor plan and layout designs for switches and resistor array, in order to obtain the overall performances and an improved behavior to ESD (electrostatic discharge) and short-circuited operation without the buffer.

Additional details regarding the present system and method may be understood by reference to the following detailed description when read in conjunction with the accompanying drawings.

BRIEF DESCRIPTION OF THE DRAWINGS

FIG. 3 illustrates a simulated transient response of one embodiment of the buffered digital potentiometer in FIG. 2 with the operational amplifier being shutdown, and the second switching device turned-on.

Common reference numerals are used throughout the drawings and detailed descriptions to indicate like elements.

DETAILED DESCRIPTION

Figure 2:
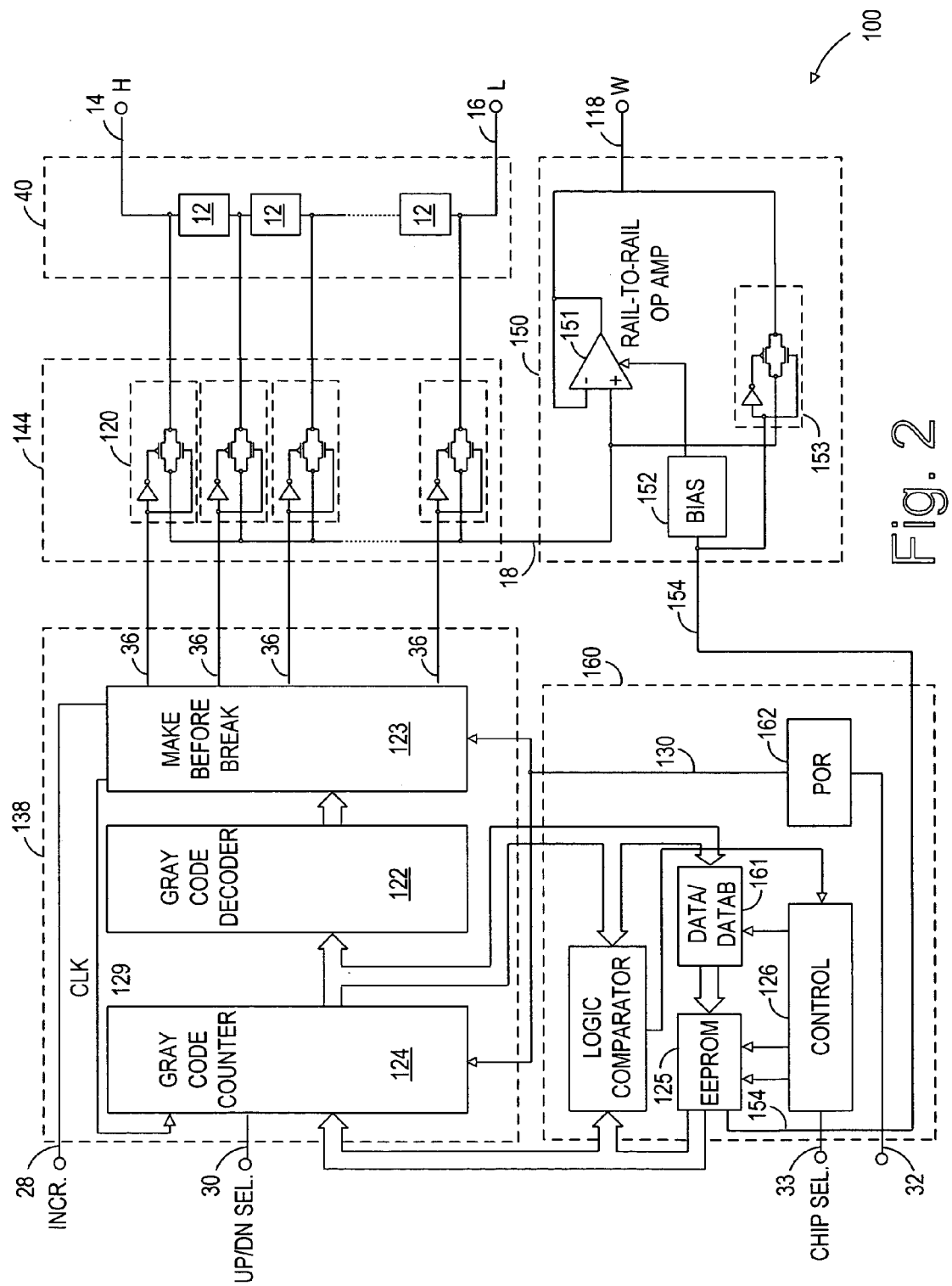
FIG. 2 is a block diagram of a buffered digital potentiometer according to an embodiment of the disclosed invention.

An embodiment of a buffered-configurable nonvolatile programmable digital potentiometer is shown as circuit 100 in FIG. 2. The series chain 40 of impedance elements comprises identical impedance elements 12. Each element 12 may comprise a poly-type resistor. A first or H signal terminal 14 and a second or L signal terminal 16 comprise ends of the chain 40. A configurable output stage 150 is connected between an internal wiper terminal 18 and a third or W signal terminal 118.

The configurable output stage 150 comprises a rail-to-rail operational amplifier 151 in unity-gain configuration, biased by a circuitry 152, and connected in parallel with a second switching device 153. The bias circuitry 152 and second switching device 153 are controlled by a configuration signal 154 in such way that the operational amplifier is biased only if the second switching device 153 is turned-off. This way, by using the configuration signal 154, either the second switching device 153 is turned-on, giving the overall behavior of a digital potentiometer without the output stage 150, or the operational amplifier 151 is biased and is working as a voltage follower, offering improved output resistance and load current capabilities.

A plurality 144 of first switching devices 120 connects every internal node (or tap) of the chain 40, to the third or internal wiper terminal 18. Each of the first switching devices 120 and the second switching device 153 comprise a CMOS transmission gate including NMOS and PMOS transistors connected in parallel. The second switching device 153 has a much lower on-resistance than the first switching devices 120. This way, it can be neglected within output resistance, if the operational amplifier is shutdown.

The second switching device 153 is larger than the first switching device 120. For example, in one embodiment, a PMOS transistor of the second switching device 153 has a channel-width of about 720 microns and a PMOS transistor of the first switching device 120 has a channel-width of about 120 microns. Similarly, an NMOS transistor of the second switching device 153 has a channel-width of about 240 microns and an NMOS transistor of the first switching device 120 has a channel-width of about 30 microns. Further, the second switching device 153 has a channel-length of about 2 microns and the first switching device 120 has a channel-length of about 1.3 microns. The larger size of the second switching device 153 helps to reduce, or minimize, its on-resistance, and also improves the frequency response thereof. The greater channel-length of the second switching device 153 also provides additional ESD performance.

Figure 1:
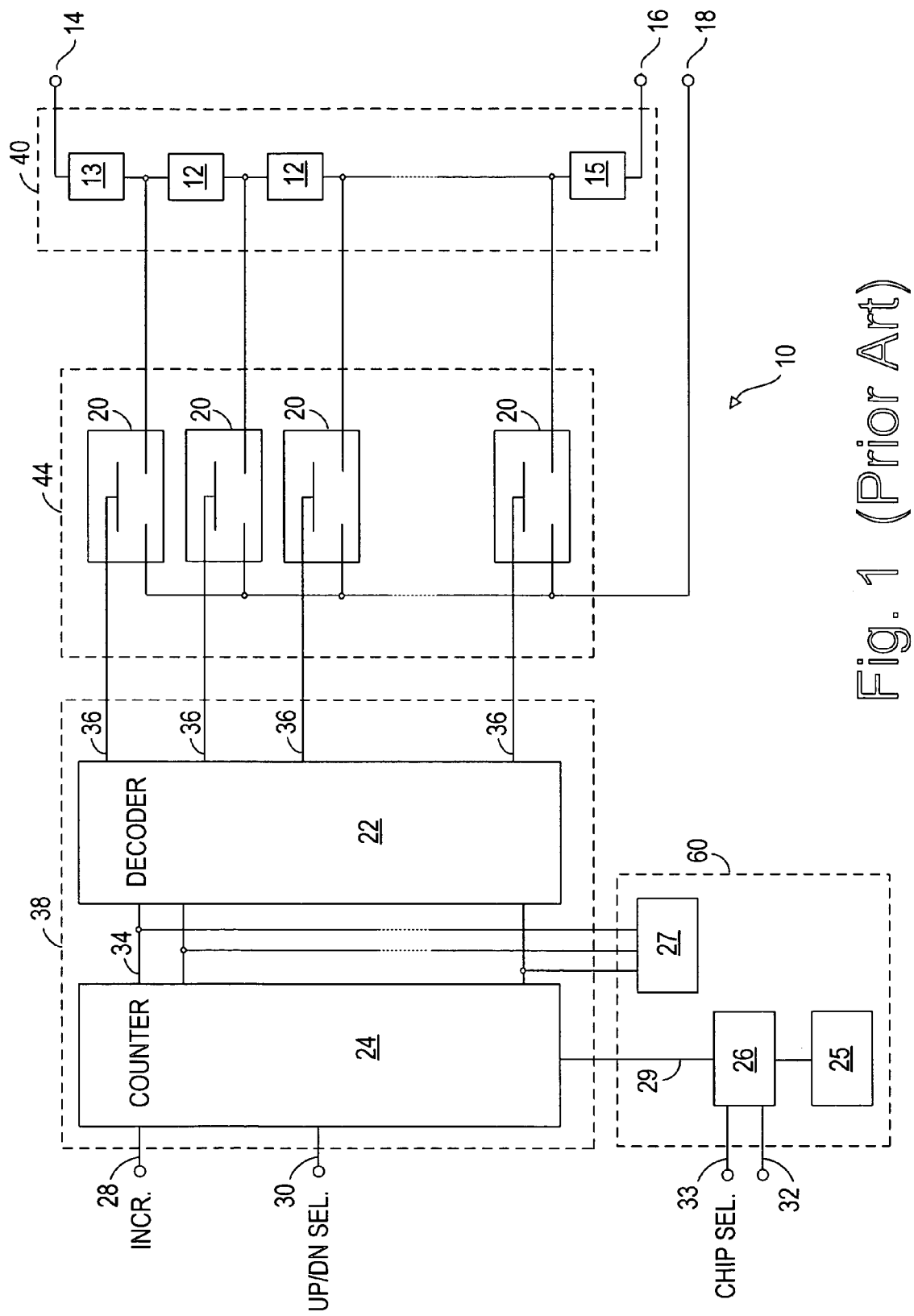
FIG. 1 is a block diagram of a prior-art digital potentiometer.

Each first switching device 120 is controlled by a signal 36 from a selecting block 138, which is an enhanced development of the prior-art selecting block 38 of FIG. 1. The selecting block 138 comprises a Gray-code counter 124 connected to a Gray-code decoder 122, which is followed by a make-before-break circuitry 123. The Gray-code counter 124 enables a single transition at a time in order to avoid glitches. The Gray-code decoder 122 is connected after the Gray-code counter 124 to identify the identity of the turned-on one of the first switching devices 120 in accordance with the status of the Gray-code counter 124. The make-before-break circuitry 123 connected between the Gray-code decoder 122 and the plurality 144 of first switching devices 120 establishes a short overlap conduction time for any adjacent pair of the first switching devices 120, one being turned-off while the other is turned-on. This way the internal wiper terminal 18 is always connected to at least one of the tap points.

The state of the Gray-code counter 124 may be incremented or decremented by signals on counter input UP/DN SEL terminal 30, and on an internal clock or CLK node 129. This CLK signal is provided by the make-before-break circuitry 123 in response to and after processing two signals: one received at an increment or INCR terminal 28, the other being the power-on-reset signal 130. The power-on reset signal 130 also enables the Gray-code counter 124.

The memory and control block 160 comprises: EEPROM cells 125, a logic comparator 127, a complement circuitry DATA/DATAB 161, a power-on-reset POR circuitry 162, and a control circuitry 126. One of the EEPROM cells 125 is reserved for the configuration signal 154 status. The logic comparator 127 is used to compare the data from the EEPROM cells 125 with the status of the Gray-code counter 124. The complement circuitry DATA/DATAB 161 is used for double writing, first the complemented status of the Gray-code counter 124, then the true status, being written in the EEPROM cells 125 in order to improve reliability. The power-on-reset POR circuitry 162 provides a signal that enables the Gray-code counter 124 and the make-before break circuitry 123 only when certain supply conditions are fulfilled. The POR circuitry 162 receives the supply voltage on a terminal 32. The control circuitry 126 is connected to receive an external input signal (CHIP SEL on a terminal 33) allowing the entire circuit to begin operation. The control circuitry 126 also receives an internal signal from the logic comparator 127 allowing the write procedure only if the status of the Gray-code counter 124 is different from the data written in the EEPROM cells 125. The control circuitry 126 provides command signals to the complement circuitry 161, the EEPROM cells 125, and the bias circuitry 152 of the operational amplifier 151.

Figure 3:
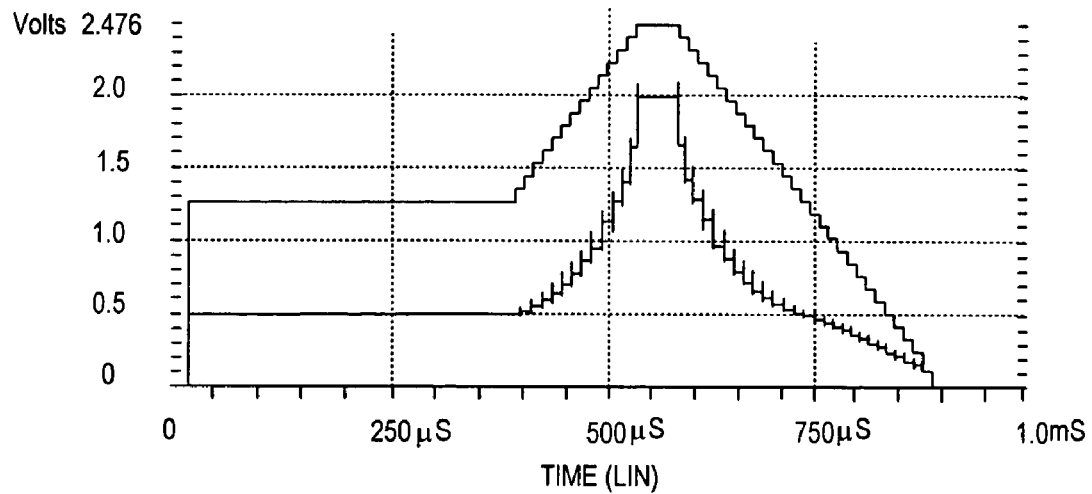

When the operational amplifier 151 is shutdown and bypassed by the second switching device 153, the circuit behavior is similar to the circuit 10 of FIG. 1. As shown in FIG. 3, when operated as a voltage divider, with terminal H connected to VDD, terminal L to GND, and terminal W to GND through a load resistor RL, the circuit 100, configured with the operational amplifier 151 shutdown and the second switching 153 device turned-on, is sensitive to output load value.

A 32-taps circuit with 10 kΩ H to L resistance was used for evaluation. After power-up, an initial wiper position is loaded from the EEPROM 125. In our case, the initial wiper position is a middle position. By moving the wiper position from the middle position to the top of the resistor chain, and back to the bottom of the resistor chain, the SPICE simulations showed that for low value RL (2 kΩ) the output voltage is much lower than expected, as shown in the lower graph. A non-linearity is also present. For higher value RL (50 kΩ), as shown in the upper graph, the error (23.9 mV at top) is within the 50% of minimum increment (in this case (VH−VL)/(number of resistors)=2.5V/31=80.6 mV). The simulation was made considering VDD=2.5V and T=25° C.

Figure 4:
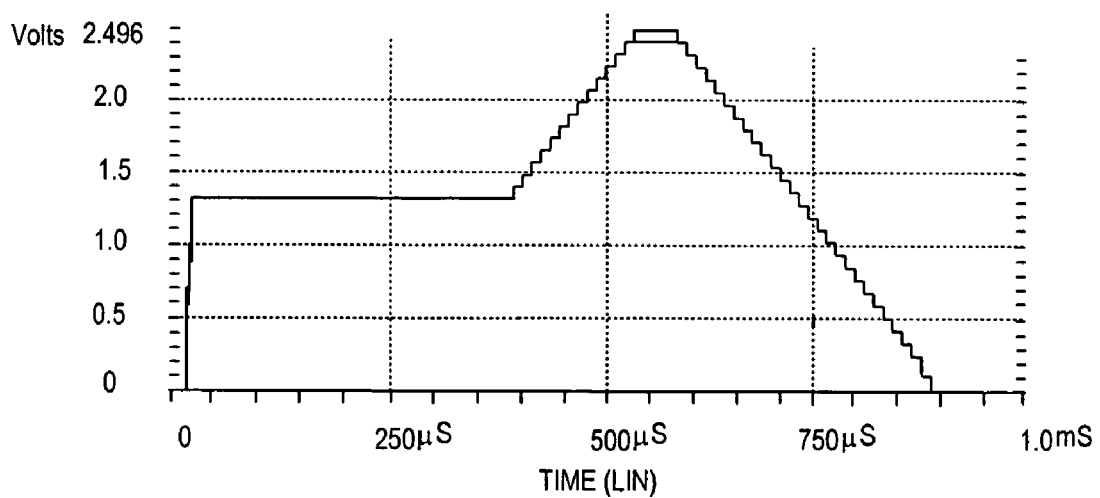
FIG. 4 illustrates a simulated transient response of one embodiment of the buffered digital potentiometer in FIG. 2 with the operational amplifier being biased, and the second switching device turned-off.

If the output stage is reconfigured, the operational amplifier 151 being biased and the second switching device 153 turned-off, a much different behavior is observed, as shown in FIG. 4. For higher value RL (50 kΩ), the error is further decreasing (5 mV at top, comparing with 23.9 mV previously). For low value RL (2 kΩ), the error and linearity is much improved, as seen in the lower graph, where the error is about 91 mV.

The simulations of FIGS. 3 and 4 were made considering a frequency of about 100 KHz for the increment signal. If a higher frequency were used, the delays brought by the operational amplifier 151 may become visible. The stand-by supply current of the operational amplifier 151 should be as low as possible, while still providing the needed frequency and transient responses. A standby supply current value of 50 μA may be considered typical for most applications.

Figure 5:
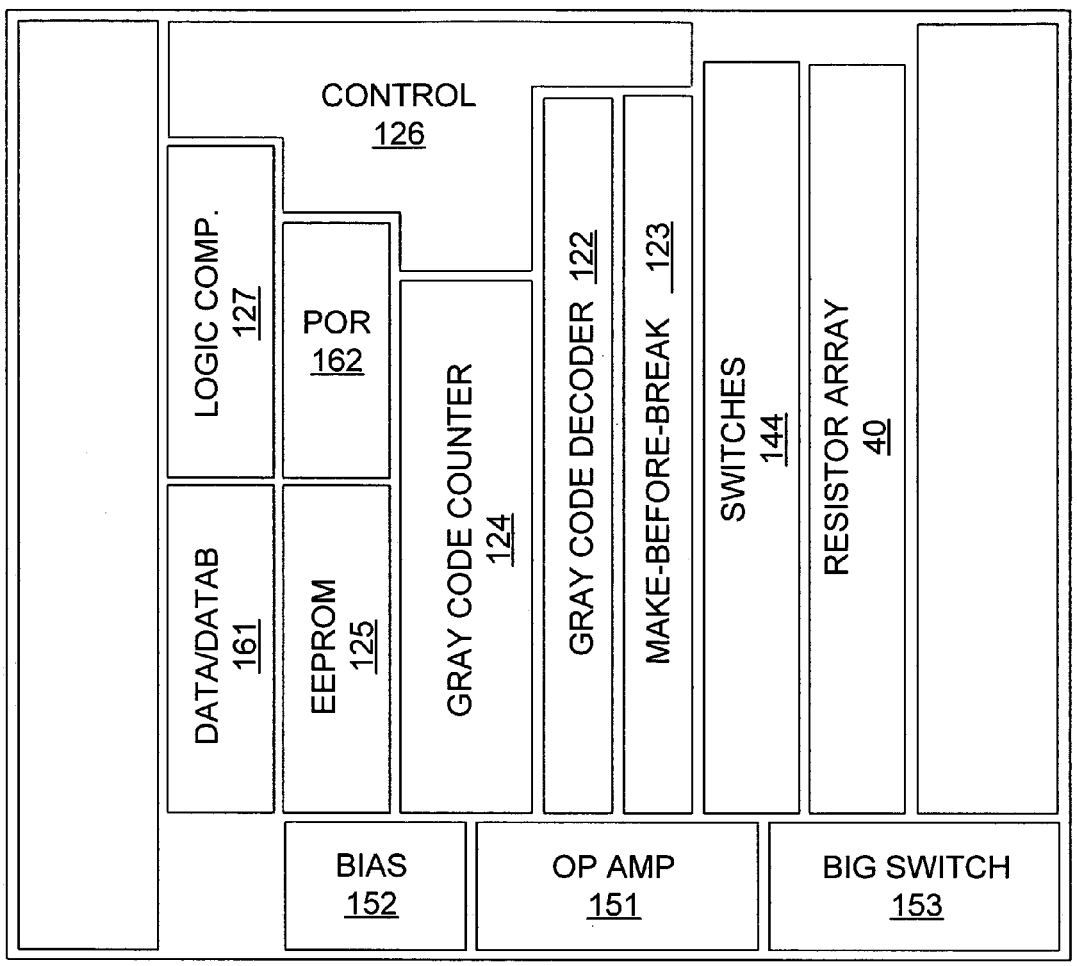
FIG. 5 shows an example floor plan for one embodiment of an integrated circuit including the buffered digital potentiometer of FIG. 2.

The floor plan of an embodiment of the present invention is presented in FIG. 5. The floor plan of FIG. 5 relates to a 32-taps 10 KΩ/20 KΩ/50 KΩ/100 KΩ circuit. Different building blocks are placed according to the necessity of matching the resistors and maintaining a minimum length in metal connections.

The impedance elements 12 may be made of high resistance poly-type resistors, having a low temperature coefficient. A typical temperature coefficient is about ±200 ppm/° C.

Figure 6:
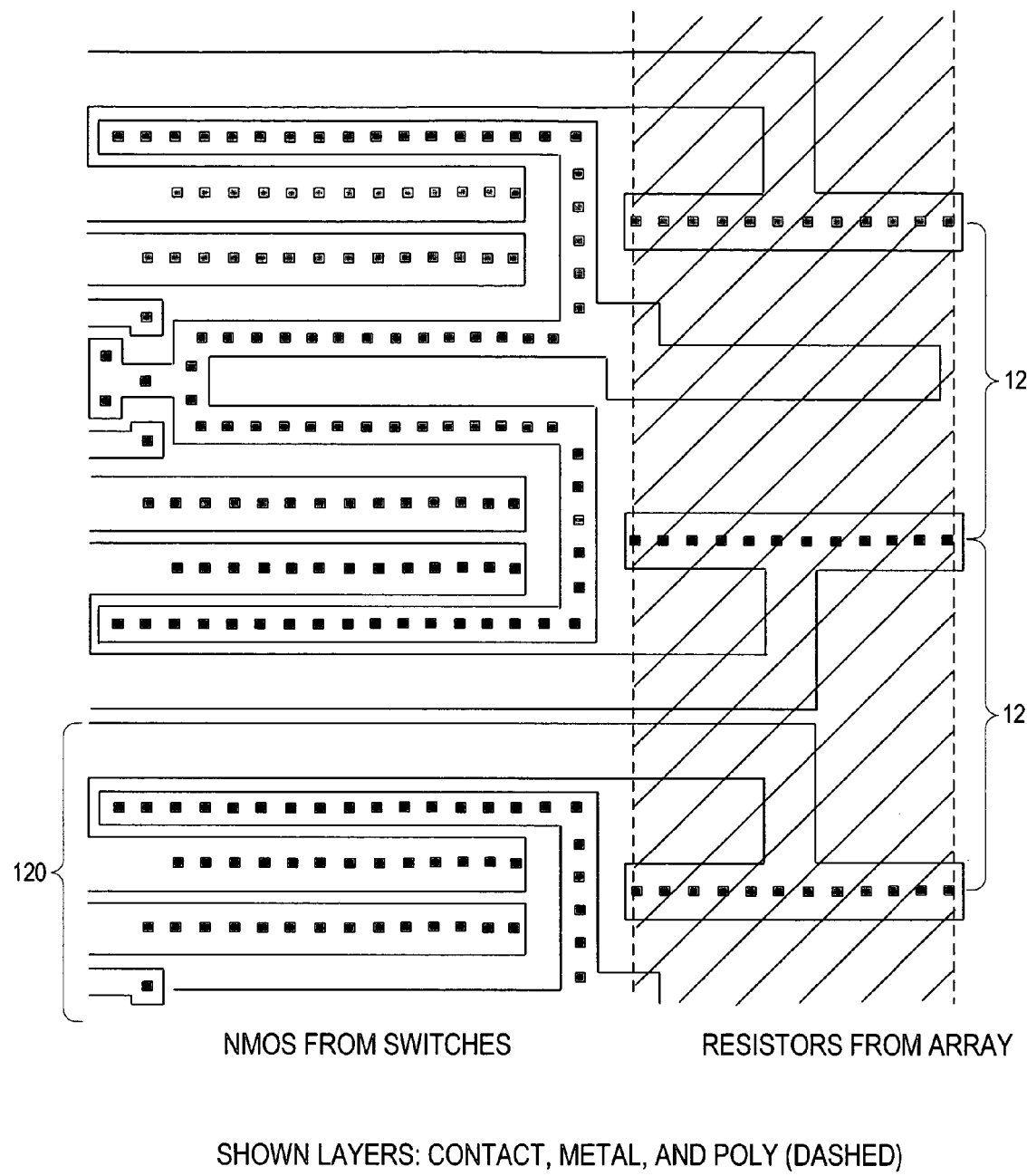
FIG. 6 shows an example mask layout detail for one embodiment of an integrated circuit including the buffered digital potentiometer of FIG. 2.

Layout was made, as shown in FIG. 6, using an increased width and number of contacts, providing additional protection in short-circuited operation when the buffer is removed. This way, a wiper current up to 5 mA can be provided without affecting the integrity of resistors. Also, by using many contacts, their intrinsic resistance is less influencing the overall value of the identical resistors 12.

The switches 120 connected close to array terminals are designed using ESD-proof rules. The number of ESD-proof CMOS transmission gates is correlated with the resistance values of the impedance elements 12. For example, in the 32-taps circuit with 10 KΩ H-to-L resistance, three ESD-proof switches 120 are provided near both H and L terminals, giving a total of six ESD-proof switches 120.

The above-described embodiments of the present invention are meant to be merely illustrative and not limiting. Thus, those skilled in the art will appreciate that various changes and modifications may be made without departing from this invention in its broader aspects. Therefore, the appended claims encompass such changes and modifications as fall within the scope of this invention.

What is claimed is:

1. An integrated circuit comprising:
   first, second, and third signal terminals;
   a chain of series-connected impedance elements with multiple tap points and having endpoints connected to the first and second signal terminals;
   a plurality of first switching devices each connected to a respective one of the multiple tap points and to an internal wiper node; and
   a configurable output stage connected to the internal wiper node and to the third signal terminal, the configurable output stage comprising a buffer and a second switching device, wherein the second switching device is operable to bypass the buffer.

2. The integrated circuit of claim 1, further comprising a selecting block coupled to control switching of each of the first switching devices, said selecting block comprising a Gray-code counter and a Gray-code decoder.

3. The integrated circuit of claim 2, wherein the switching of a pair of the first switching devices is make-before-break switching.

4. The integrated circuit of claim 1, further comprising a selecting block coupled to control switching of each of the first switching devices, wherein the switching of a pair of the first switching devices is make-before-break switching.

5. The integrated circuit of claim 1, further comprising a memory circuit coupled to store an identity of a single-turned on one of the first switching devices.

6. The integrated circuit of claim 5, wherein the memory circuit is a non-volatile memory circuit.

7. The integrated circuit of claim 1, wherein the configurable output stage further comprises a bias circuit, and the buffer comprises an operational amplifier, and
   wherein the bias circuit is controlled to provide a bias to the operational amplifier only when the second switching device is off.

8. The integrated circuit of claim 7, further comprising a memory circuit coupled to store an identity of a single-turned on one of the first switching devices and a status of a configuration signal, said configuration signal controlling the bias circuit and the second switching device.

9. The integrated circuit of claim 1, further comprising a switching circuit that controls switching of the first switching devices, wherein the switching circuit employs Gray code.

10. An integrated circuit, comprising:
    first, second, and third signal terminals;
    a chain of series-connected impedance elements with multiple tap points and having endpoints connected to the first and second signal terminals;
    a plurality of first switching devices each connected to a respective one of the multiple tap points and to an internal wiper node;
    a configurable output stage connected to the internal wiper node and to the third signal terminal, the configurable output stage comprising a buffer connected in parallel with a second switching device, wherein a bias circuitry of the buffer and the second switching device are controlled by a configuration signal such that the buffer is biased only when the second switching device is turned-off;
    a selecting block indicating an identity of a turned-on one of the first switching devices; and
    a memory block for storage of the identity of the turned-on one of the first switching devices, and for the storage of a status of the configuration signal.

11. The integrated circuit of claim 10, wherein the selecting block comprises:
    a Gray-code counter; and
    a Gray-code decoder, connected after the Gray-code counter to identify the identity of a turned-on one of the first switching devices in accordance with the status of the Gray-code counter.

12. The integrated circuit of claim 11, wherein the selecting block comprises:
a make-before-break circuitry connected between the Gray-code decoder and the first switching devices, the make-before-break circuitry establishing a short overlap conduction time for a pair of the first switching devices, the overlap ensuring that the internal wiper terminal is always connected to at least one of the tap points.

13. The integrated circuit of claim 10, wherein the selecting block comprises:
a make-before-break circuitry, the make-before-break circuitry establishing a short overlap conduction time for a pair of the first switching devices, the overlap ensuring that the internal wiper terminal is always connected to at least one of the tap points.

14. An integrated circuit comprising:
first and second signal terminals;
a chain of series-connected impedance elements with multiple tap points and having endpoints connected to the first and second signal terminals;
a plurality of first switching devices each connected to a respective one of the multiple tap points and to a wiper node;
a selecting block coupled to control a switching of the first switching devices, the selecting block employing Gray code; and
a make-before-break circuitry, the make-before-break circuitry establishing a short overlap conduction time for a pair of the first switching devices, the overlap ensuring that the wiper node is always connected to at least one of the tap points.

15. The integrated circuit of claim 14, wherein the selecting block comprises:
a Gray-code counter; and
a Gray-code decoder connected after the Gray-code counter to identify a turned-on one of the first switching devices in accordance with the status of the Gray-code counter.

16. The integrated circuit of claim 14, further comprising a memory circuit coupled to store an identity of a single-turned on one of the first switching devices.

17. An integrated circuit comprising:
first and second signal terminals;
a chain of series-connected impedance elements with multiple tap points and having endpoints connected to the first and second signal terminals;
a plurality of first switching devices each connected to a respective one of the multiple tap points and to a wiper node;
a selecting block coupled to control a switching of the first switching devices, the selecting block employing Gray code; and
a configurable output stage connected to the wiper node and to a third signal terminal, the configurable output stage comprising a buffer and a second switching device, wherein the second switching device is operable to bypass the buffer.

18. The integrated circuit of claim 17, further comprising a memory circuit coupled to store an identity of a single-turned on one of the first switching devices and a status of a configuration signal, said configuration signal controlling the second switching device.

19. The integrated circuit of claim 17, wherein the selecting block comprises:
a Gray-code counter; and
a Gray-code decoder connected after the Gray-code counter to identify a turned-on one of the first switching devices in accordance with the status of the Gray-code counter.

20. The integrated circuit of claim 19, wherein the selecting block further comprises:
a make-before-break circuitry, the make-before-break circuitry establishing a short overlap conduction time for a pair of the first switching devices, the overlap ensuring that the wiper node is always connected to at least one of the tap points.

21. The integrated circuit of claim 17, wherein the selecting block further comprises:
a make-before-break circuitry, the make-before-break circuitry establishing a short overlap conduction time for a pair of the first switching devices, the overlap ensuring that the wiper node is always connected to at least one of the tap points.

22. The integrated circuit of claim 17, further comprising a memory circuit coupled to store an identity of a single-turned on one of the first switching devices.

23. An integrated circuit comprising:
first and second signal terminals;
a chain of series-connected impedance elements with multiple tap points and having endpoints connected to the first and second signal terminals;
a plurality of first switching devices each connected to a respective one of the multiple tap points and to wiper node;
a selecting block coupled to control a switching of the first switching devices, the selecting block employing Gray code; and
a memory circuit coupled to store an identity of a single-turned on one of the first switching devices, wherein the memory circuit is configured to store the identity only if the identity is different from an identity already stored in the memory circuit.

* * * * *